(12) United States Patent
Kim et al.

(10) Patent No.: US 11,521,889 B2
(45) Date of Patent: Dec. 6, 2022

(54) CONDUCTIVE POROUS CERAMIC SUBSTRATE AND METHOD OF MANUFACTURING SAME

(71) Applicants: MAX TECH CO., LTD., Daegu (KR); Tri-N CO., LTD., Gumi (KR)

(72) Inventors: Byoung Hak Kim, Daegu (KR); Seung Woo Baik, Daegu (KR); June Beom Choi, Chilgok-gun (KR); In Woong Kim, Daegu (KR); Jong Yeol Jung, Daegu (KR); Chun Moo Lee, Daegu (KR); Gyu Ha Kim, Daegu (KR); In Bum Shin, Gumi (KR)

(73) Assignees: MAX TECH CO., LTD., Daegu (KR); Tri-N CO., LTD., Gumi (KR)

(*) Notice: Subject to any disclaimer, the term of this patent is extended or adjusted under 35 U.S.C. 154(b) by 770 days.

(21) Appl. No.: 16/457,152

(22) Filed: Jun. 28, 2019

(65) Prior Publication Data
US 2020/0013665 A1    Jan. 9, 2020

(30) Foreign Application Priority Data
Jul. 5, 2018 (KR) .................. 10-2018-0078138

(51) Int. Cl.
| H01L 21/683 | (2006.01) |
| B28B 11/24 | (2006.01) |
| C04B 38/06 | (2006.01) |
| C04B 35/462 | (2006.01) |
| B25B 11/00 | (2006.01) |
| C04B 35/626 | (2006.01) |

(52) U.S. Cl.
CPC ........ *H01L 21/6838* (2013.01); *B25B 11/005* (2013.01); *B28B 11/243* (2013.01); *C04B 35/462* (2013.01); *C04B 38/068* (2013.01); *C04B 35/62655* (2013.01); *C04B 2235/3232* (2013.01); *C04B 2235/3234* (2013.01); *C04B 2235/3241* (2013.01); *C04B 2235/3262* (2013.01); *C04B 2235/656* (2013.01)

(58) Field of Classification Search
CPC . H01L 21/6838; B28B 11/243; C04B 35/462; C04B 38/068; C04B 35/62655; C04B 2235/3232; C04B 2235/3241; C04B 2235/3262; C04B 2235/656
See application file for complete search history.

(56) References Cited

U.S. PATENT DOCUMENTS 5,834,106 A * 11/1998 Kamiaka .............. C04B 35/111
                                                                            257/E23.009

FOREIGN PATENT DOCUMENTS

| JP | 2000256074 A | 9/2000 |
| KR | 1019950031986 A | 12/1995 |
| KR | 0155186 B1 | 12/1998 |
| KR | 100368474 B1 | 3/2003 |
| KR | 20050030274 A | 3/2005 |

(Continued)

*Primary Examiner* — Karl E Group
*Assistant Examiner* — Cameron K Miller

(57) ABSTRACT

The present invention relates to a conductive porous ceramic substrate and a method of manufacturing the same, and more particularly to a conductive porous ceramic substrate, in which a porous ceramic substrate used as a chuck or stage for fixing a thin semiconductor wafer substrate or display substrate through vacuum adsorption is imparted with anti-static performance so as to prevent the generation of static electricity, and a method of manufacturing the same.

4 Claims, 14 Drawing Sheets

(56) References Cited

FOREIGN PATENT DOCUMENTS

| KR | 20100109098 A | 10/2010 |
| KR | 20100121895 A | 11/2010 |

\* cited by examiner

Crystal structure of TiO₂

Presence and position of dopant in doped $TiO_2$, large & white sphere = O, medium size & black = Ti, small & gray = dopants

| Dopant | Zn | Li | Nb | Mg | Mn | W |
|---|---|---|---|---|---|---|
| Sintering Temperature (°C) | 1200 | 1250 | 1250 | 1200 | 1200 | 1350 |
| Density (g/cm³) | 4.17 | 3.91 | 4.07 | 3.94 | 3.94 | 3.83 |
| Resistance (Ω·cm) | >10¹³ | 6.8 × 10⁹ | 4.5 × 10⁸ | 4.7 × 10¹⁰ | 3.5 × 10⁹ | 3.5 × 10⁸ |
| | | | | | | |

| Dopant | Ni | Co | Cu | Cr | Fe |
|---|---|---|---|---|---|
| Sintering Temperature (°C) | 1200 | 1200 | 1000 | 1350 | 1250 |
| Density (g/cm³) | 4.1 | 4.08 | 4.13 | 3.76 | 4.04 |
| Resistance (Ω·cm) | 2.0 × 10¹¹ | 2.7 × 10¹¹ | 7.2 × 10⁸ | 4.9 × 10⁷ | 1.9 × 10¹¹ |
| | | | | | |

Fig. 7

| Sintering Temperature 1200 °C | |
|---|---|
| Density (g/cm³) | 3.94 |
| Resistance (Ω·cm) | $3.5 \times 10^9$ |

| Sintering Temperature 1100 °C | |
|---|---|
| Density (g/cm³) | 3.55 |
| Resistance (Ω·cm) | $1.0 \times 10^8$ |

| Sintering Temperature 1000 °C | |
|---|---|
| Density (g/cm³) | 2.93 |
| Resistance (Ω·cm) | $1.5 \times 10^8$ |

Micorstructure depending on amount of added graphite powder

Microstructure depending on sintering temperature

CONDUCTIVE POROUS CERAMIC SUBSTRATE AND METHOD OF MANUFACTURING SAME

CROSS REFERENCE TO RELATED APPLICATION

The present application claims priority based on Korean Patent Application No. 10-2018-0078138, filed Jul. 5, 2018, the entire content of which is incorporated herein for all purposes by this reference.

BACKGROUND OF THE INVENTION

1. Technical Field

The present invention relates to a conductive porous ceramic substrate and a method of manufacturing the same, and more particularly to a conductive porous ceramic substrate, in which a porous ceramic substrate used as a chuck or stage for fixing a thin semiconductor wafer substrate or display substrate through vacuum adsorption is imparted with antistatic performance so as to prevent the generation of static electricity, and a method of manufacturing the same.

2. Description of the Related Art

A porous ceramic substrate is mainly used as a chuck (which is referred to as 'chuck' or 'stage' by a variety of manufacturers) for seating and fixing a semiconductor wafer or a display substrate such as a glass panel in various processes for manufacturing semiconductors, and is also employed as a substrate for use in a water treatment foamer, i.e. an air diffuser, a heat exchanger, a water treatment separator membrane, a gas separator membrane, and various supports, and is manufactured by shaping various ceramic powders as main materials in the form of a chuck or stage and then performing sintering at a high temperature. The body of the porous ceramic substrate has large numbers of fine pores through which air passes or pores that allow water to pass therethrough so that a workpiece seated thereon may be vacuum-adsorbed and fixed thereto, or may be used as a separator membrane for passing a liquid such as water, etc. therethrough.

Meanwhile, in the case where a porous ceramic substrate is used as a chuck for fixing a semiconductor wafer, the semiconductor wafer, which has been adsorbed and fixed on the porous ceramic substrate, which is nonconductive, generates a trace amount of frictional static electricity when separated therefrom. Conventionally, static electricity has not been regarded as a big problem because the semiconductor wafer is so thick that it is hardly influenced by such static electricity and thus there is almost no defect caused by the static electricity.

However, in recent years, as electronic products such as smartphones, smart TVs, etc. are becoming lighter and slimmer, semiconductor wafers and various display substrates used therefor are becoming thinner and larger in area, and the pattern printed thereon is becoming finer. Accordingly, static electricity generated during the process of seating the semiconductor wafer and the display substrate on the porous ceramic substrate or separating the same therefrom is transferred to electronic components such as semiconductor devices integrated on the semiconductor wafer and the display substrate, undesirably causing defects such as short-circuiting of the printed pattern and the like. Furthermore, in the process of separating the wafer and the display substrate from the chuck, there are frequent problems such as cracking of the wafer due to static electricity, and therefore the need for a porous ceramic substrate having antistatic performance has become urgent.

With the goal of solving the above problems due to static electricity generated from the chuck or stage in a conventional semiconductor-processing apparatus, a chuck or stage having antistatic performance has been developed, and is disclosed in Korean Patent Application Publication No. 10-2010-0109098 (hereinafter, referred to as "Prior Invention 1") and Korean Patent Application Publication No. 10-2010-0121895 (hereinafter, referred to as "Prior Invention 2").

Prior Invention 1 discloses a work stage, in which the generation of static electricity is minimized on the surface of the stage in contact with the substrate, the manufacturing cost thereof is reduced, sheet resistance may be appropriately adjusted, the coefficient of friction is low, and wear resistance is improved. With regard to Prior Invention 1, as shown in FIG. 1, a carbon nanotube coating film 25 is provided on a metal stage 20.

However, in Prior Invention 1, the body of the stage is made of a metal material such as aluminum, rather than a porous ceramic, and the surface of the body of the stage is additionally coated to thus form a conductive carbon nanotube coating film, thereby exhibiting antistatic performance. Hence, Prior Invention 1 is problematic because of complicated manufacturing processing and high manufacturing costs, and when the carbon nanotube coating film formed on the body of the stage is damaged, a problem in which the entire stage has to be replaced occurs. Moreover, there is a problem in that the upper surface of the body of the stage is hermetically coated and thus a large-area thin wafer or display substrate cannot be vacuum-adsorbed thereto. With reference to FIG. 2, Prior Invention 2 includes a base layer 11 made of a glass material and an antistatic layer 12 having antistatic performance through crystallization thermal treatment of impurity-doped titanium dioxide ($TiO_2$) on the base layer.

In Prior Invention 2, the base body is made of a glass material, as in the work stage in Prior Invention 1, and Prior Invention 2 is also problematic in that the manufacturing process is complicated and manufacturing time and costs are increased because the antistatic layer is formed on the glass base layer through additional deposition and thermal treatment. Also, in the case in which the antistatic layer is damaged, the entire substrate has to be replaced, which is undesirable, and there is a structural problem such that vacuum adsorption cannot be carried out.

Japanese Patent Application Publication No. 2000-256074 (hereinafter, referred to as "Prior Invention 3") discloses adjusting the coefficient of thermal expansion of a porous ceramic material to $9 \times 10^{-6}/°C$. (about 20 to 800° C.) or less by adding 100 wt % of a composition, comprising alumina, silicon carbide, zirconia, and zircon, alone or in combination, with 1 to 15 wt % of any one additive or a mixture of two or more selected from among $SiO_2$, $TiO_2$, CaO, MgO, $Li_2O$, $Al_2O_3$, $K_2O$, $Na_2O$, CuO, $Cr_2O_3$, $CeO_2$, $MnO_2$, and NiO and then performing firing at a temperature ranging from 1300 to 1550° C.

However, Prior Invention 3 aims to adjust the coefficient of thermal expansion of the porous ceramic but not to impart antistatic performance by adjusting electrical conductivity. Also, since each of alumina, zirconia or zircon, which is the main material in Prior Invention 3, has a broad bandgap, it is difficult to decrease electrical conductivity through doping of an additive. Furthermore, silicon carbide is disadvantageous because the material price is high and, in the manufacturing process, it is necessary to maintain a non-oxidizing atmosphere through a technique such as vacuum-furnace sintering, undesirably increasing manufacturing costs.

CITATION LIST

Patent Literature

Korean Patent Application Publication No. 10-2010-0109098
Korean Patent Application Publication No. 10-2010-0121895
Japanese Patent Application Publication No. 2000-256074

SUMMARY OF THE INVENTION

Accordingly, the present invention has been made keeping in mind the problems encountered in the related art, and an objective of the present invention is to provide a conductive porous ceramic substrate, in which a main ceramic material, titanium oxide ($TiO_2$), is doped with an additive and is thus semiconductorized, thereby exhibiting both conductivity and porosity to ultimately enable not only electrostatic prevention but also vacuum adsorption, and a method of manufacturing the same.

In order to accomplish the above objective of the present invention, the present invention provides a method of manufacturing a conductive porous ceramic substrate, the method comprising: preparing a mixed powder by adding a titanium oxide ($TiO_2$) powder with $MnCO_3$ and $Cr_2O_3$ powders and a graphite powder and performing mixing and drying; compacting the mixed powder of $MnCO_3$, $Cr_2O_3$, $TiO_2$ and graphite in a die under pressure to afford a shaped body; and sintering the shaped body thus obtained at a temperature ranging from 1000° C. to 1300° C. in an ambient air atmosphere, wherein in the preparing the mixed powder, the $TiO_2$ powder, as a main material, is added with the $MnCO_3$ and $Cr_2O_3$ powders, in which the $MnCO_3$ and $Cr_2O_3$ powders are mixed at a molar ratio of 9:1 and the mixed $MnCO_3$ and $Cr_2O_3$ powders are added in an amount of 5 mol % to 15 mol % relative to the $TiO_2$ powder.

Also, the graphite powder may be added in an amount of 5 wt % to 15 wt % based on the total amount of the mixed powder of $MnCO_3$, $Cr_2O_3$ and $TiO_2$.

In addition, the present invention provides a conductive porous ceramic substrate, having a microstructure the surface of which is formed with pores by Mn- and Cr-doped $TiO_{2-x}$ particles and $(Mn,Cr)TiO_3$ particles adjacent to each other, and having a volume resistance ranging from $10^6$ Ω·cm to $10^9$ Ω·cm.

Also, the conductive porous ceramic substrate may have a porosity ranging from 20% to 50%.

According to the present invention, a conductive porous ceramic substrate has both porosity for vacuum adsorption and conductivity for electrostatic prevention, and thus when it is used as a chuck (or a stage) for a semiconductor wafer or a display substrate, a large-area thin semiconductor wafer or display substrate can be vacuum-adsorbed safely and static electricity is not generated upon seating of the wafer or the display substrate thereon or separation therefrom, whereby integrated circuits printed on the semiconductor wafer or the display substrate are not electrically influenced.

Also, according to the present invention, the conductive porous ceramic substrate has consistent porosity and conductivity throughout, and thus, even when scratching or cracking occurs on the upper surface of the substrate, it is only necessary to polish the upper surface of the substrate to restore the flatness thereof, obviating the need to replace the entire substrate, ultimately realizing a long lifespan compared to a conventional chuck having an antistatic coating layer.

In addition, according to the present invention, a method of manufacturing the conductive porous ceramic substrate includes sintering a ceramic powder at a low temperature ranging from 1,200 to 1,300° C. in an ambient air atmosphere, rather than sintering at a high temperature of 2,100° C. or more in a specific gas atmosphere, thus obtaining a conductive porous ceramic substrate, thereby drastically reducing the energy and time necessary for sintering, resulting in environmentally friendly and economical effects.

BRIEF DESCRIPTION OF DRAWINGS

FIG. 7 shows the results of density and volume resistance depending on the sintering temperature of each ceramic substrate manufactured through the process of Test Example 1 according to a preferred embodiment of the present invention;

DESCRIPTION OF SPECIFIC EMBODIMENTS

The following merely illustrates the principle of the invention. Therefore, those skilled in the art will be able to devise various devices which, although not explicitly described or shown herein, embody the principle of the invention and are included in the concept and scope of the invention. It is also to be understood that all conditional terms and embodiments described in this specification are, in principle, only intended for the purpose of enabling the inventive concept to be understood and are not to be construed as being limited to the specifically described embodiments and conditions.

The above and other objectives, features and advantages of the present invention will become more apparent from the following detailed description taken in conjunction with the accompanying drawings, and accordingly, those skilled in the art can easily carry out the technical ideas of the present invention.

Hereinafter, a detailed description will be given of a conductive porous ceramic substrate and a method of manufacturing the same according to preferred embodiments of the present invention with reference to the appended drawings.

Before the detailed description, a conductive porous ceramic substrate according to the present invention, which is provided in the form of a rectangular parallelepiped substrate, is mainly used as a vacuum chuck or stage in semiconductor equipment for adsorbing and fixing a thin plate-shaped workpiece, but it is understood that the shape and use thereof may be variously modified and utilized depending on the end use, so long as the structure thereof remains the same.

The conductive porous ceramic substrate according to a preferred embodiment of the present invention is a porous ceramic substrate which has therein fine pores, which are difficult to observe with the naked eye, and has conductivity for electrostatic prevention, rather than a nonconductor, unlike a general porous ceramic substrate.

In a preferred embodiment of the present invention, the surface of the microstructure of the conductive porous ceramic substrate is formed with pores by Mn- and Cr-doped $TiO_{2-x}$ particles and (Mn,Cr)$TiO_3$ particles adjacent to each other, and the volume resistance of the conductive porous ceramic substrate falls in the range of $10^6$ Ω·cm to $10^9$ Ω·cm.

Figure 1:
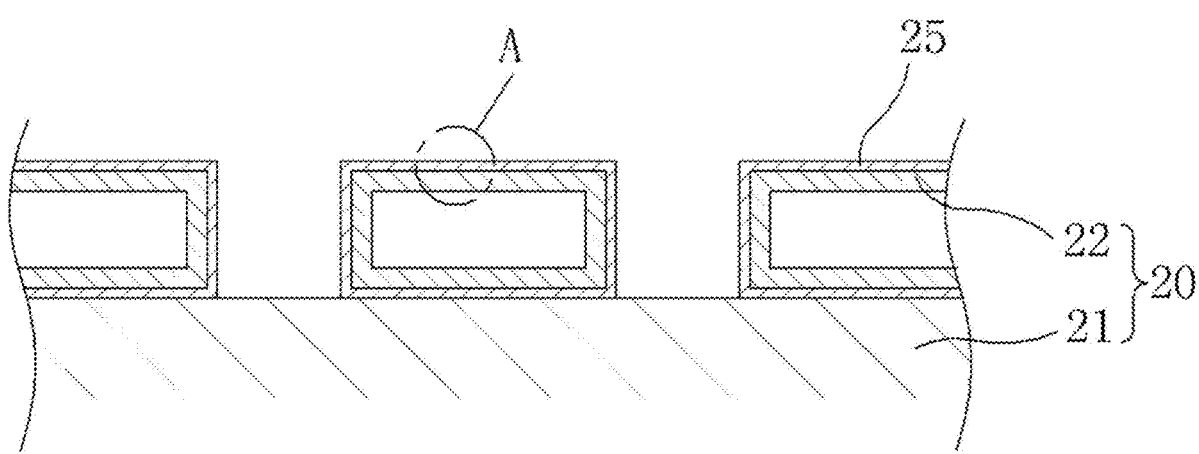
FIGS. 1 and 2 show conventional techniques.
Figure 2:
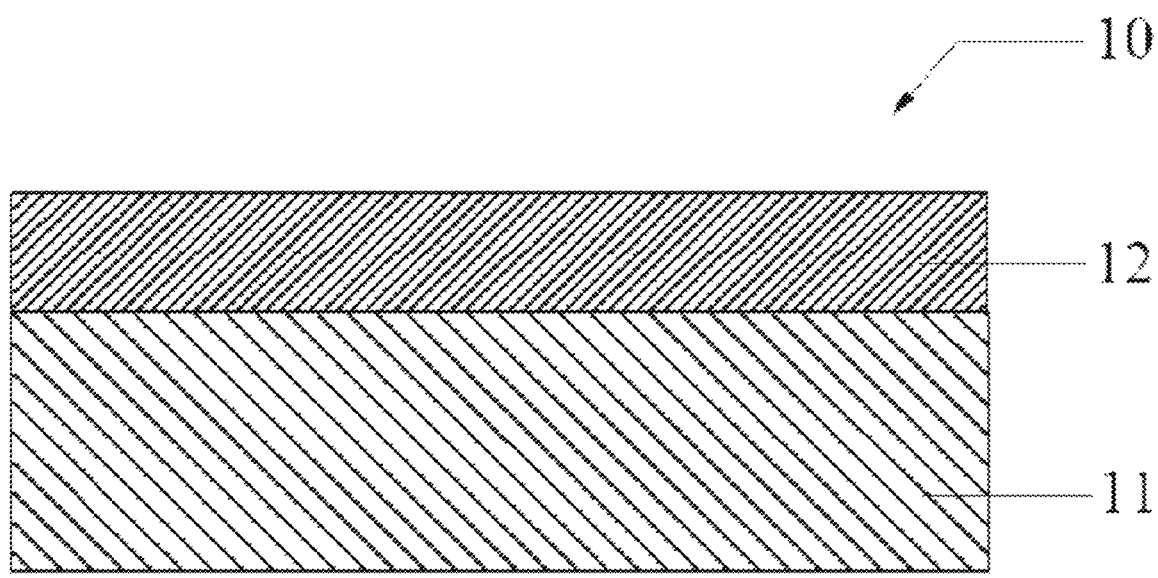
Figure 3:
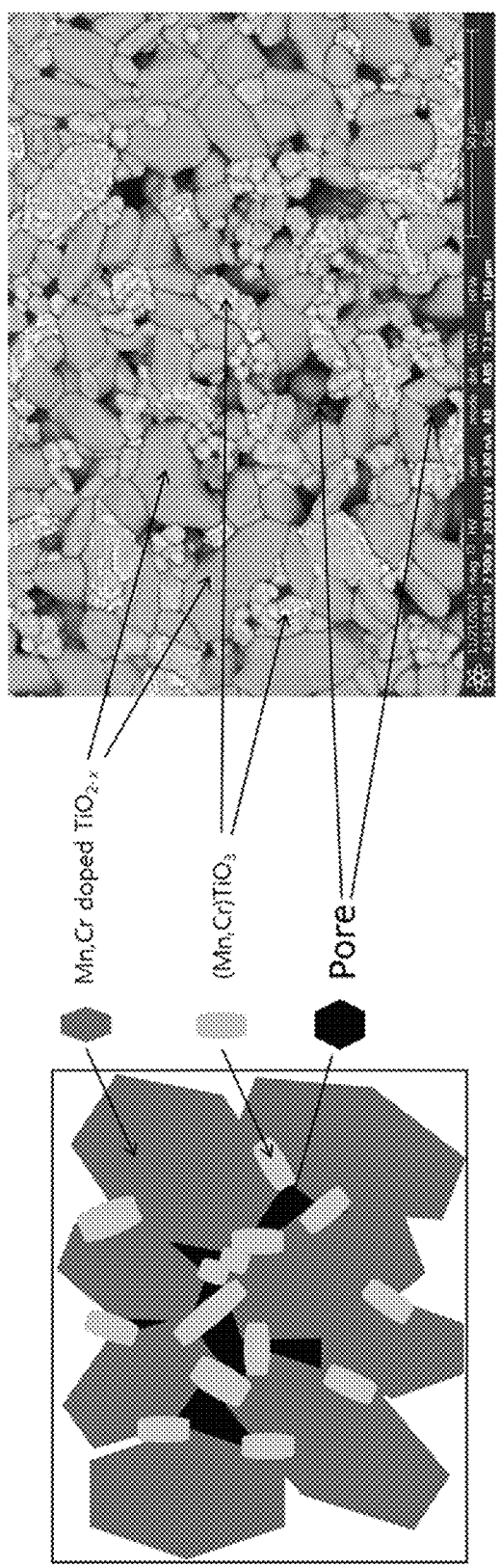
FIG. 3 shows a microstructure of a conductive porous ceramic substrate according to a preferred embodiment of the present invention.

The microstructure of the conductive porous ceramic substrate according to a preferred embodiment of the present invention, having conductivity, is schematically shown in FIG. 3. As shown in FIG. 3, the microstructure of the conductive porous ceramic substrate is configured such that empty spaces, that is, pores, are formed by Mn- and Cr-doped $TiO_{2-x}$ particles and (Mn,Cr)$TiO_3$ particles.

Figure 4A:
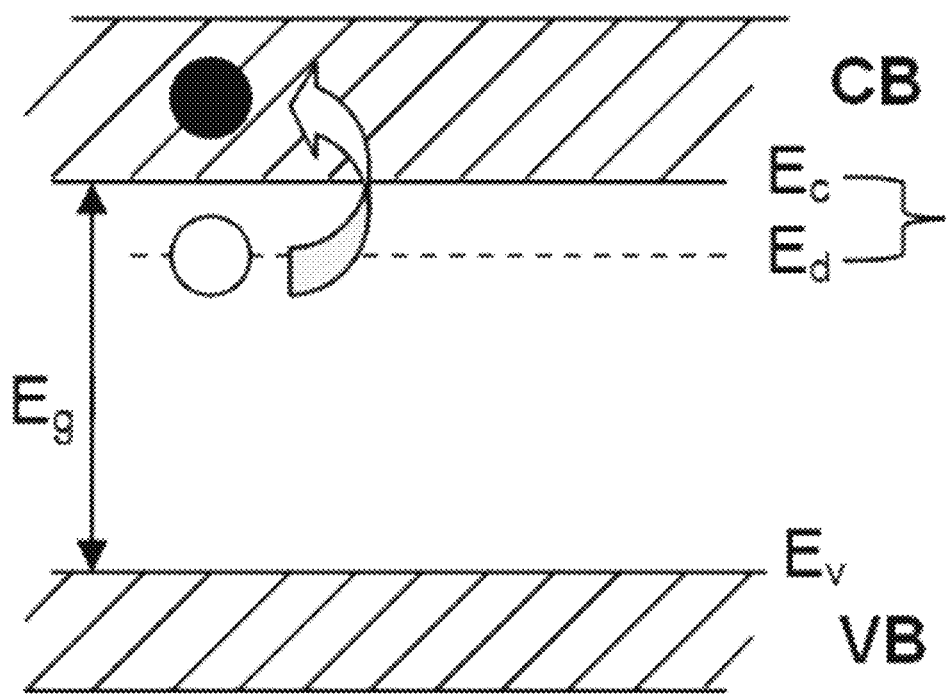
FIGS. 4A and 4B show an n-type semiconductor and a p-type semiconductor, respectively.
Figure 4B:
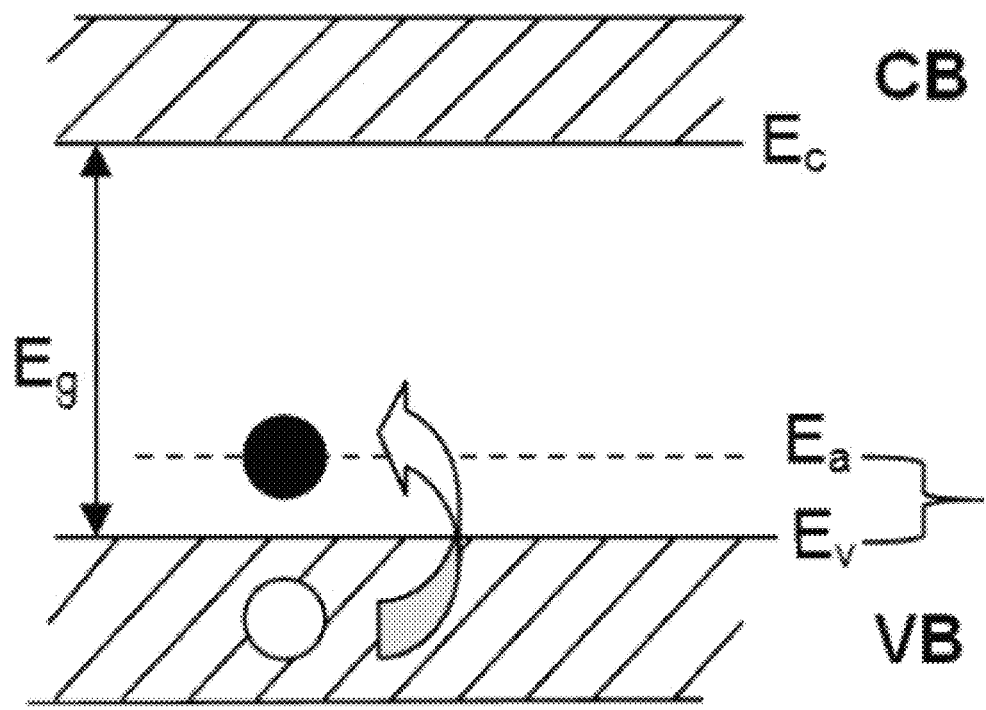

A ceramic may be doped with a heterogeneous element and thus semiconductorized, and examples thereof include an n-type semiconductor and a p-type semiconductor. This is a way to create a new energy state in the energy bandgap of the ceramic. With reference to FIGS. 4A and 4B, the formation of an n-type semiconductor through donor doping enables a donor energy band ($E_d$) to be created directly below the conduction band (CB) to thus allow electrons present in the donor energy band ($E_d$) to jump easily to the conduction band (CB). On the other hand, the formation of a p-type semiconductor through acceptor doping enables an acceptor energy band ($E_a$) to be created directly above the valence band to thus allow holes in the valence band to jump easily to the acceptor energy band ($E_a$). In this way, an energy band in which new electrons or holes may exist in the energy bandgap is formed, whereby the charge carrier may easily move through the bandgap.

In the case of a ceramic such as alumina (8.7 eV), zirconia (5.0 eV), zircon (5.0 eV), or $SiO_2$ (9.0 eV), each of which has an excessively broad energy bandgap, even when a new energy band is created through doping, charge transfer becomes very difficult due to the excessively broad bandgap, and the material becomes a nonconductor.

Hence, a ceramic material having a bandgap such that charges are transferred through doping has to be selected, and ceramics such as SiC, $TiO_2$, ZnO, $CeO_2$, $SnO_2$ and the like are representative materials having an energy bandgap of about 3 eV. Among these, silicon carbide (SiC) is excellent in physical properties such as strength, hardness and the like, but the material price thereof is high, and furthermore, it is a non-oxide and thus cannot be prepared in air, and hence it has to be prepared in a non-oxidizing atmosphere in order to prevent the oxidation thereof. Cerium oxide ($CeO_2$) and tin oxide ($SnO_2$) cannot be used in large amounts in the manufacture of a porous ceramic due to the very high material prices thereof. Also, cerium oxide ($CeO_2$) and zinc oxide (ZnO) have low strength and thus have a problem upon application to a large area.

Therefore, the ceramic substrate according to a preferred embodiment of the present invention includes titanium oxide ($TiO_2$) ceramic, which is semiconductorized through additive doping to thereby enable the formation of a large area while ensuring both conductivity and porosity.

Figure 5A:
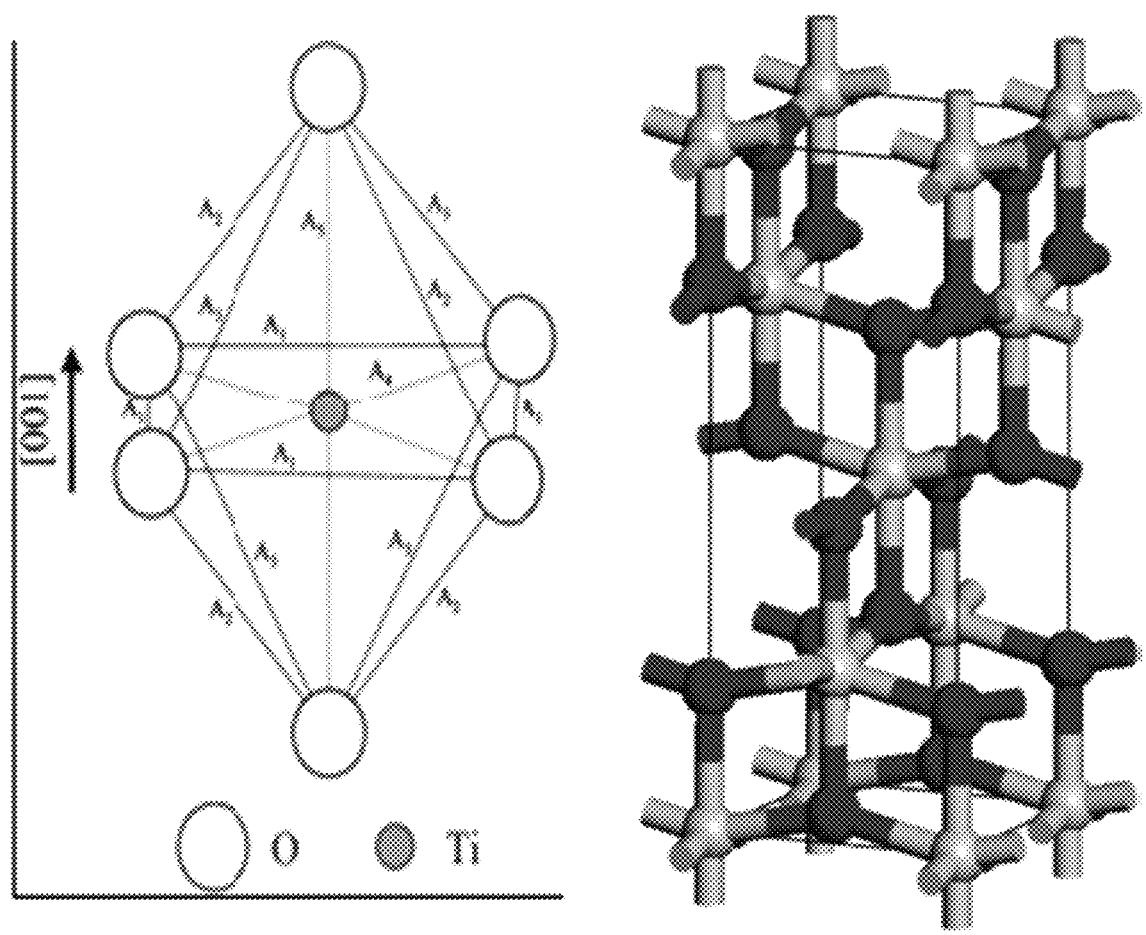
FIG. 5A shows the crystal structure of $TiO_2$ and FIG. 5B shows the presence and position of a dopant in doped $TiO_2$.
Figure 5B:
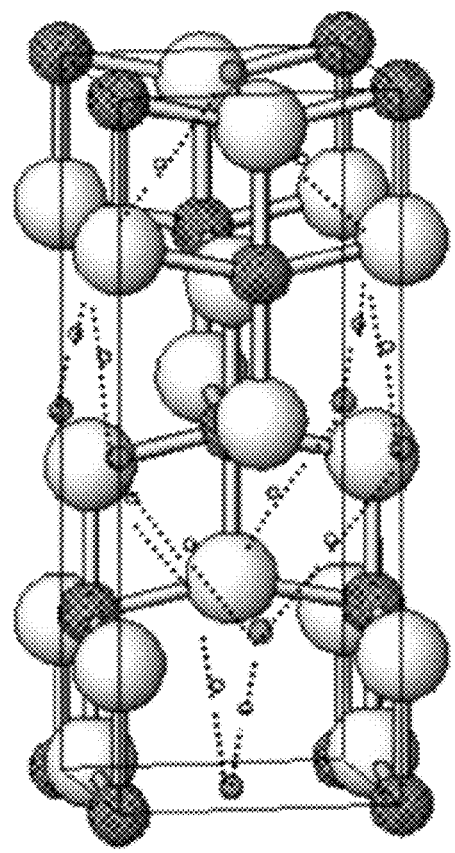
Figure 6:
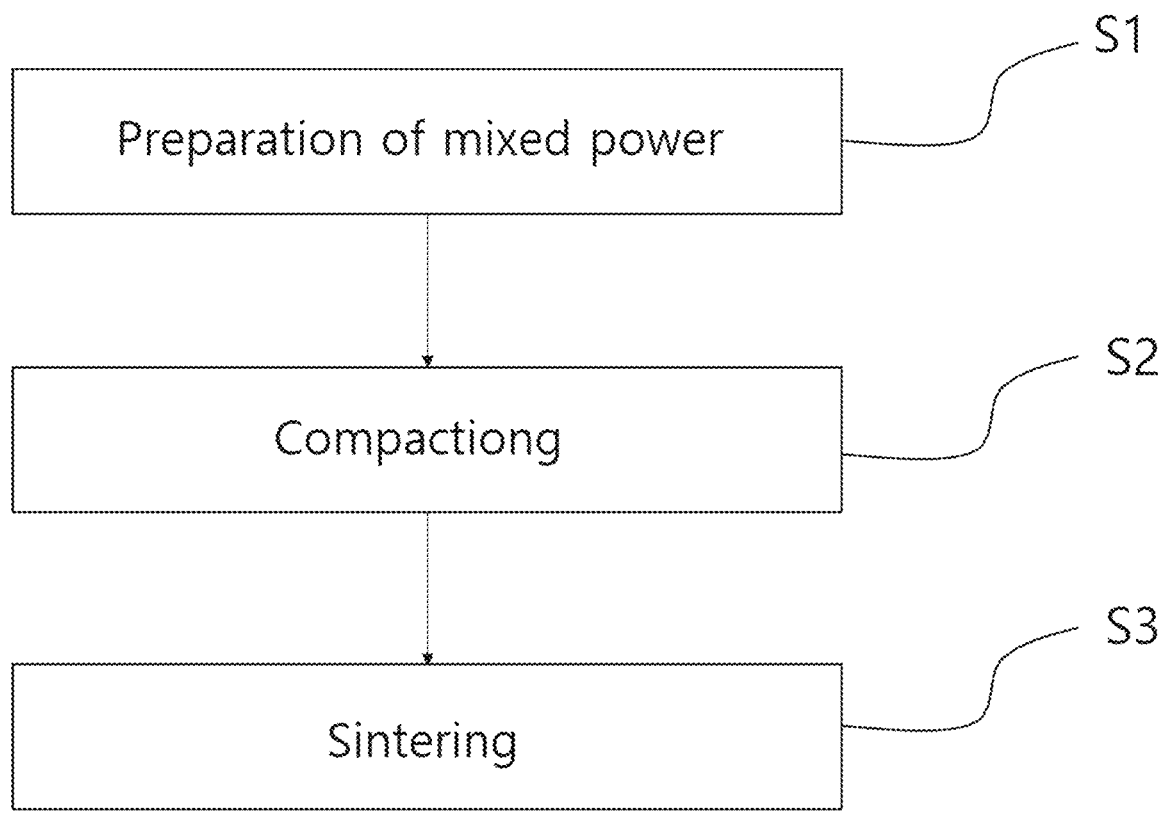
FIG. 6 is a flowchart showing a process of manufacturing a conductive porous ceramic substrate according to a preferred embodiment of the present invention.

With reference to FIGS. 5A and 5B, titanium oxide ($TiO_2$) has a structure that has a distorted octahedral geometry in which titanium (Ti) is 6-fold coordinated with oxygen (O), and includes three polymorphs, namely, anatase, rutile, and brookite. Titanium oxide ($TiO_2$) basically has intrinsic defects such as oxygen vacancies and Ti interstitials, and is thus a non-stoichiometric compound represented by a defect chemical formula of $TiO_{2-x}$. Furthermore, it has an energy bandgap of about 3.2 eV, in which the bandgap may be decreased depending on the extent of reduction through thermal treatment in a reducing atmosphere or by reduction through N doping, thereby adjusting electrical resistance. However, such a reduction process should be accompanied by thermal treatment in a reducing atmosphere, which essentially requires expensive equipment such as a vacuum furnace and a high-cost process.

The conductive porous ceramic substrate according to a preferred embodiment of the present invention is a substrate the electrical resistance of which is adjusted through semiconductorization using additive doping, rather than thermal treatment in a reducing atmosphere. It is possible to form an n-type semiconductor through donor doping of $Nb^{5+}$, $V_{5+}$, $Cr^{5+}$ or $Cr^{6+}$, which has a higher valence than $Ti^{4+}$. Also, it is possible to form a p-type semiconductor through acceptor doping of $Mn^{2+}$ or $Mn^{3+}$ or $Fe^{2+}$ or $Fe^{3+}$, which has a lower valence than $Ti^{4+}$. This doping enables the concentration of an O vacancy or $Ti^{3+}$ interstitial in titanium oxide ($TiO_2$) to increase, and such defects act as charge transfer carriers, resulting in increased electrical conductivity.

The porosity of the conductive porous ceramic substrate according to a preferred embodiment of the present invention is preferably 20 to 50%. If the porosity thereof is less than 20%, the suction force of the substrate may decrease. On the other hand, if the porosity thereof exceeds 50%, the strength of the substrate may decrease.

Below is a description of the method of manufacturing the conductive porous ceramic substrate having the microstructure ad properties described above according to a preferred embodiment of the present invention.

The method of manufacturing the conductive porous ceramic substrate according to a preferred embodiment of the present invention includes preparing a mixed powder by subjecting a titanium oxide ($TiO_2$) powder to addition with MnCO$_3$ and Cr$_2$O$_3$ powders and a graphite powder, mixing and drying (S1); compacting the mixed powder of MnCO$_3$, Cr$_2$O$_3$, TiO$_2$ and graphite in a die under pressure to afford a shaped body (S2); and sintering the shaped body thus obtained at a temperature ranging from 1000° C. to 1300° C. in an air atmosphere (S3).

In the preparing the mixed powder (S1), the main material, that is, the TiO$_2$ powder, is added with the MnCO$_3$ and Cr$_2$O$_3$ powders, the MnCO$_3$ and Cr$_2$O$_3$ powders being mixed at a molar ratio of 9:1 and the mixed MnCO$_3$ and Cr$_2$O$_3$ powders being added in an amount of 5 mol % to 15 mol % relative to the TiO$_2$ powder.

In the preparing the mixed powder (S1), the TiO$_2$ powder is added with the MnCO$_3$ and Cr$_2$O$_3$ powders and the graphite powder, mixed using a ball mill, and dried using a spray dryer, thus obtaining a mixed powder. Here, it is preferred that the MnCO$_3$ and Cr$_2$O$_3$ powders, which are added to the main material TiO$_2$ powder, be mixed at a molar ratio of 9:1 and then 5 to 15 mol % thereof be added to the TiO$_2$ powder. If the amount of the MnCO$_3$ and Cr$_2$O$_3$ powders relative to TiO$_2$ is less than 5 mol %, conductivity for electrostatic prevention cannot be obtained. On the other hand, if the amount thereof exceeds 15 mol %, the sintered body of the substrate of the present invention may crack. Hence, the amount thereof preferably falls in the range of 5 to 15 mol %.

Also, the graphite powder, which is added together with the MnCO$_3$ and Cr$_2$O$_3$ powders to the TiO$_2$ powder, functions to form pores through combustion during the sintering process. In order to obtain a porosity of 20 to 50%, the graphite powder is added in an amount of 5 to 20 wt % based on the total amount of the mixed powder of TiO$_2$, MnCO$_3$ and Cr$_2$O$_3$. If the amount of the graphite powder is less than 5 wt % based on the total amount of the mixed powder of TiO$_2$, MnCO$_3$ and Cr$_2$O$_3$, the porosity may be lowered to 20% or less and thus the suction force of the substrate may decrease, making it difficult to perform vacuum adsorption. On the other hand, if the amount thereof exceeds 20 wt %, the porosity may be increased to 50% or more, and thus the strength of the substrate may decrease, which is undesirable. Hence, the amount of the graphite powder preferably falls in the range of 5 to 20 wt %.

Next, in the compacting (S2), the mixed powder of TiO$_2$, MnCO$_3$, Cr$_2$O$_3$ and graphite obtained in the preparing the mixed powder (S1) is compacted in a die under pressure, thus obtaining a shaped body in a substrate form having a rectangular parallelepiped shape.

Finally, in the sintering (S3), the shaped body obtained in the compacting (S2) is sintered at a temperature of 1,200 to 1,300° C. in an ambient air atmosphere. The ceramic material is sintered in a temperature range of 1,200 to 1,300° C. in an ambient air atmosphere, unlike sintering at a high temperature of 2,100 to 2,200° C. in a gas atmosphere of Ar, N or the like.

Since the sintering is performed at a slightly low temperature of 1,200 to 1,300° C. in an air atmosphere in this way, the energy cost necessary for sintering may be drastically decreased, and an additional sintering gas and a sintering furnace in a vacuum are obviated, thus increasing the convenience of the sintering process.

After completion of the sintering process, TiO$_2$, having an electrical resistance of 10$^{12}$ Ω·cm, is decreased in electrical resistance due to an increase in defects such as oxygen vacancies and Ti interstitials, that is, an increase in the concentration of charge transfer carrier. For example, a Ti$^{3+}$ compound T$_2$O$_3$ has a electrical resistance of 10$^{-1}$ Ω·cm, and a Ti$^{2+}$ compound TiO has an electrical resistance of 10$^{-5}$ Ω·cm. The present invention is intended to adjust the electrical resistance through transition metal doping alone, and makes it difficult to form pure T$_2$O$_3$ and TiO phases because thermal treatment in a reducing atmosphere is not performed. Some Ti exists as Ti$^{3+}$, so it has an electrical conduction mechanism due to electron doping between Ti$^{4+}$ and Ti$^{3+}$.

The electrical resistance was measured using a resistance meter (Trek Resistance meter 152-1) for measuring volume resistance by the guarded electrode method. Here, measurement was performed using a concentric ring probe (152-CR-1) in accordance with IEC 61340-2, which is a standard for volume resistance among ANSI/ESD association standards.

Test Example 1

The effect on electrical resistance of adding divalent, trivalent, pentavalent and hexavalent elements to TiO$_2$ was evaluated. Among these, divalent and trivalent elements were used to test acceptor doping effects, and pentavalent and hexavalent elements were used to test donor doping effects.

To the TiO$_2$ powder, each dopant, such as Zn, Li, Nb, Mg, Mn, W, Ni, Co, Cu, Cr and Fe in respective forms of ZnO, Li$_2$CO$_3$, Nb$_2$O$_5$, MgO, MnCO$_3$, WO$_3$, NiO, CoO, CuO, Cr$_2$O$_3$ and Fe$_2$O$_3$, was added in an amount of 5 mol %, followed by mixing using a ball mill and then drying using a spray dryer, thus affording a granular mixed powder, which was then compacted in a die under pressure of 600 Kgf/cm$^2$ to form a shaped body having a rectangular parallelepiped shape, after which the shaped body was sintered at a temperature ranging from 900 to 1,350° C. in an air atmosphere, thereby manufacturing ceramic test samples. The density and volume resistance of the test samples were measured. The results are shown in FIG. 7.

As a whole, the donor doping, rather than the acceptor doping, was more effective at decreasing electrical resistance, which is deemed to be because the ion radius of the acceptor element that is added is relatively large and it is not subjected to solid solution in the TiO$_2$ lattice. The ionic radius of Ti$^{4+}$ was 0.745 Å, and the ionic radii of acceptors having a valence lower than Ti$^{4+}$ are as follows.

Zn$^{2+}$=0.88 Å, Li1+=0.9 Å, Mg$^{2+}$=0.86 Å, Mn$^{2+}$=0.97, Fe$^{2+}$=0.92 Å, Co$^{2+}$=0.885 Å, Ni$^{2+}$=0.83 Å, Cu$^{2+}$=0.87 Å, Mn$^{3+}$=0.785 Å, Fe$^{3+}$=0.785 Å

These acceptors have ionic radii much greater than the ionic radius of Ti$^{4+}$, making it difficult to realize Ti ion site substitution, and thus form a secondary phase or exist independently, and therefore are regarded as not contributing to a decrease in electrical resistance. Mn$^{3+}$ and Fe$^{3+}$ have ionic radii similar to the ionic radius of Ti$^{4+}$, and are thus assumed to enable Ti ion site substitution. Here, Mn doping exhibits electrical resistance of 10$^9$ Ω·cm but Fe doping manifests electrical resistance of 10$^{11}$ Ω·cm, which is considered to be due to changes in the valence of Mn and Fe depending on the sintering temperature.

In contrast, the ionic radii of donors having a valence higher than Ti$^{4+}$ are as follows.

Cr$^{6+}$=0.58 Å, Nb$^{5+}$=0.78 Å, W$^{6+}$=0.74 Å

These donors have ionic radii similar to or smaller than the ionic radius of Ti$^{4+}$ to thus substitute for a Ti ion site, thereby increasing the concentration of defects such as oxygen vacancies, ultimately decreasing electrical resistance.

Based on the test results, $Mn^{3+}$ and $Cr^{6+}$ were determined to be most effective at acceptor doping and donor doping, respectively.

Test Example 2

A $TiO_2$ powder was added with an $MnCO_3$ powder in amounts of 0 mol %, 5 mol %, 10 mol %, and 15 mol % relative to $TiO_2$, mixed using a ball mill and then dried using a spray dryer, thus affording a granular mixed powder, which was then compacted in a die under pressure of 600 Kgf/cm$^2$ to form a shaped body having a rectangular parallelepiped shape, after which the shaped body was sintered at a temperature of 1,200° C. in an air atmosphere, thereby manufacturing ceramic substrates.

Figure 8:
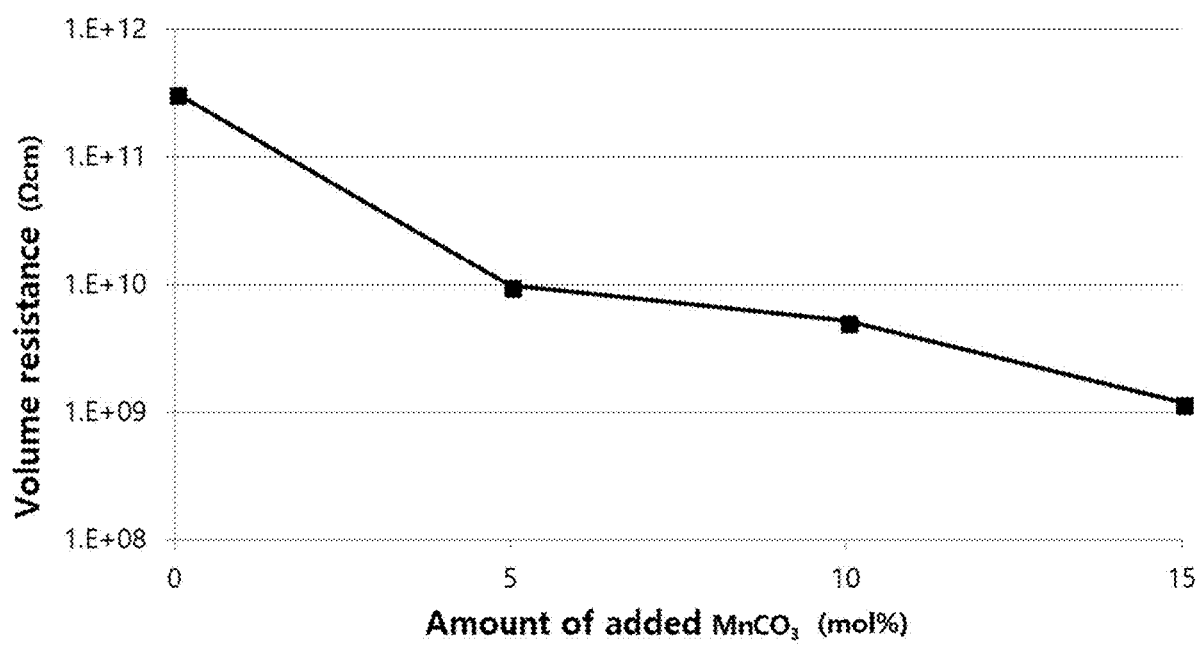
FIG. 8 is a graph showing the results of volume resistance depending on the amount of added $MnCO_3$ of each ceramic substrate manufactured through the process of Test Example 2 according to a preferred embodiment of the present invention.

The volume resistance of each ceramic substrate depending on the amount of $MnCO_3$ that was added was measured. The results are shown in FIG. 8. As shown in FIG. 8, when the $MnCO_3$ powder was added in an amount of about 5 to 15 mol % relative to $TiO_2$, a resistance value of $10^9$ Ω·cm for electrostatic prevention was attained. In this way, when the $MnCO_3$ powder was added alone, it was confirmed to finely decrease the resistance value of the substrate.

Test Example 3

A $TiO_2$ powder was added with an $MnCO_3$ powder in an amount of 5 mol % relative to $TiO_2$, mixed using a ball mill and then dried using a spray dryer, thus affording a granular mixed powder, which was then compacted in a die under pressure of 600 Kgf/cm$^2$ to form a shaped body, after which the shaped body was sintered at temperatures of 1000, 1100 and 1200° C. in an air atmosphere, thereby manufacturing ceramic substrates.

Figure 9:
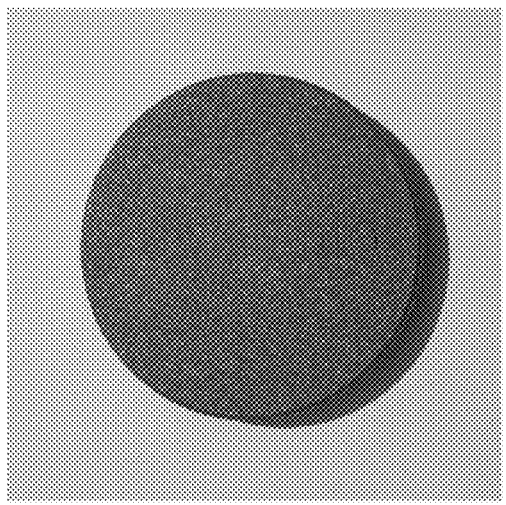
FIG. 9 shows the results of density and volume resistance depending on the sintering temperature of each ceramic substrate manufactured through the process of Test Example 3 according to a preferred embodiment of the present invention.
Figure 9:
Figure 9:
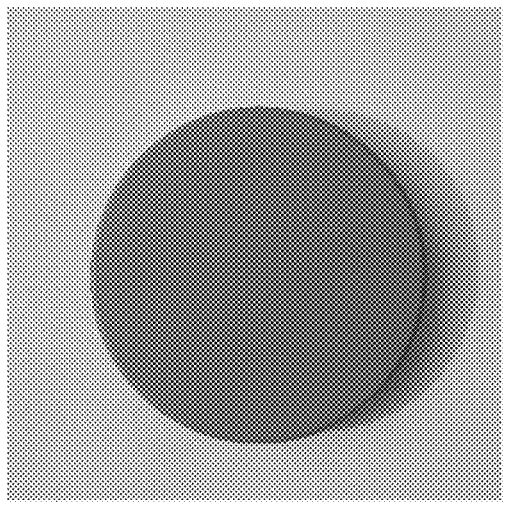

The density and volume resistance of each ceramic substrate depending on the sintering temperature were measured. The results are shown in FIG. 9. As shown in FIG. 9, when the sintering temperature was adjusted, an electrical resistance value ($10^6$ to $10^9$ Ω·cm) for electrostatic prevention was obtained.

Test Example 4

A $TiO_2$ powder was added with a $Cr_2O_3$ powder in a amount of 5 mol % relative to $TiO_2$, mixed using a ball mill, and then dried using a spray dryer, thus affording a granular mixed powder, which was then compacted in a die under pressure of 600 Kgf/cm$^2$ to form a shaped body, after which the shaped body was sintered at temperatures of 1000, 1100, 1200, 1250 and 1350° C. in an air atmosphere, thereby manufacturing ceramic substrates.

Figure 10:
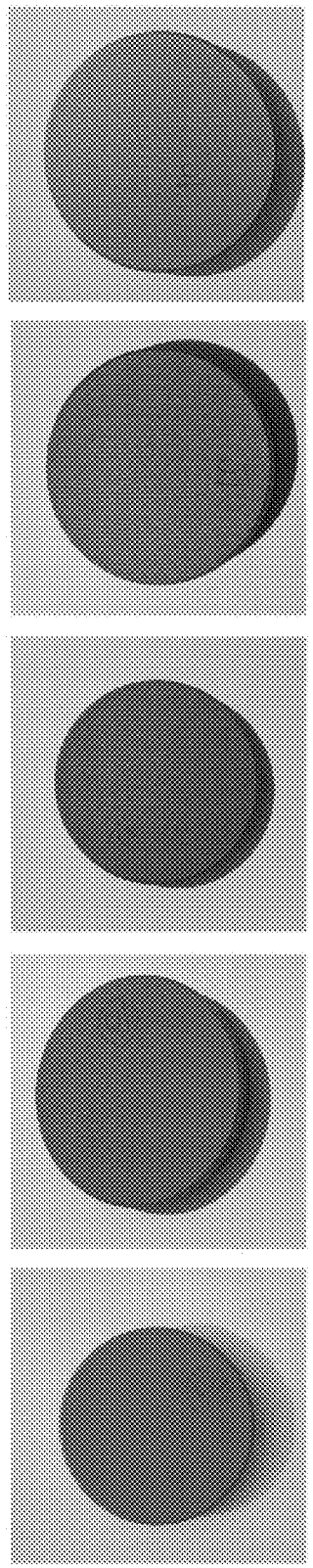
FIG. 10 shows the results of density and volume resistance depending on the sintering temperature of each ceramic substrate manufactured through the process of Test Example 4 according to a preferred embodiment of the present invention.

The density and volume resistance of each ceramic substrate depending on the sintering temperature were measured. The results are shown in FIG. 10. As shown in FIG. 10, when the sintering temperature was adjusted in the range of 1000 to 1350° C., an electrical resistance value for electrostatic prevention was obtained.

Test Example 5

A $TiO_2$ powder was added with $MnCO_3$ and $Cr_2O_3$ powders, mixed at a molar ratio 9:1, in amounts of 0 mol %, 5 mol %, 10 mol %, and 15 mol % relative to $TiO_2$, mixed using a ball mill and then dried using a spray dryer, thus affording a granular mixed powder, which was then compacted in a die under pressure of 600 Kgf/cm$^2$ to form a shaped body having a rectangular parallelepiped shape, after which the shaped body was sintered at a temperature of 1200° C. in an air atmosphere, thereby manufacturing ceramic substrates.

The volume resistance of each ceramic substrate depending on the amount of $MnCO_3$ and $Cr_2O_3$ powders (mixed at 9:1) that were added was measured. The results are shown in FIG. 11.

Figure 11:
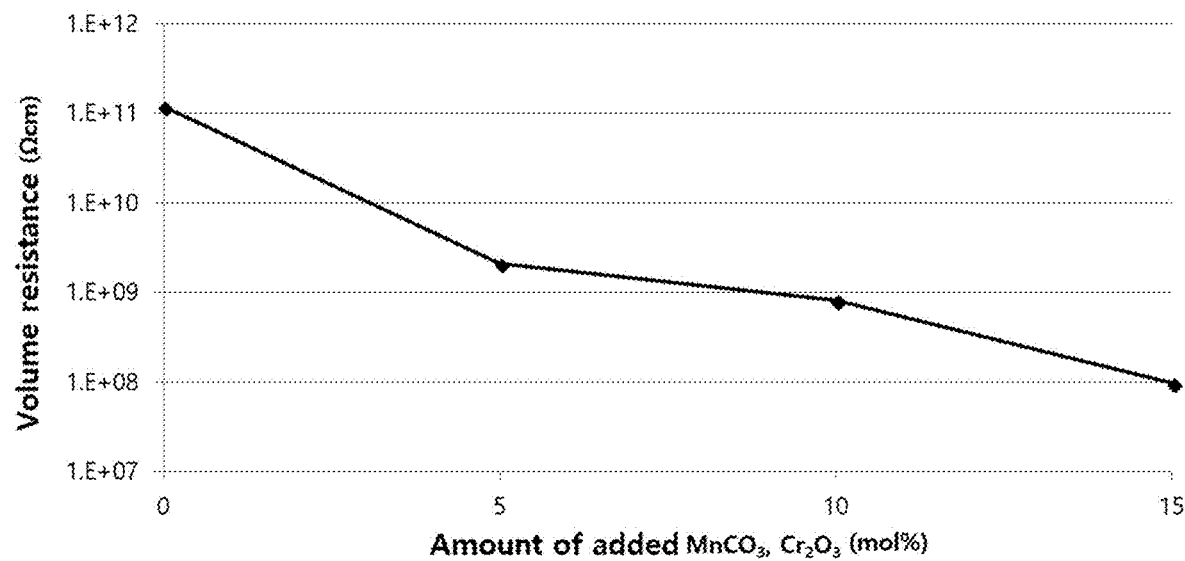
FIG. 11 is a graph showing the results of volume resistance depending on the amount of added $MnCO_3$ and $Cr_2O_3$ powders (mixed at 9:1) of each ceramic substrate manufactured through the process of Test Example 5 according to a preferred embodiment of the present invention.

As shown in FIG. 11, when the $TiO_2$ powder was added with the $MnCO_3$ and $Cr_2O_3$ powders mixed at 9:1, rather than with $MnCO_3$ powder alone, the electrical resistance value was further decreased. Also, when 5 to 15 mol % of the $MnCO_3$ and $Cr_2O_3$ powders mixed at 9:1 was added to the $TiO_2$ powder, an electrical resistance value of $10^6$ to $10^9$ Ω·cm for electrostatic prevention was obtained.

Test Example 6

A graphite powder was added in amounts of 5, 10, 15 and 20% based on the total amount of a mixed powder of $TiO_2$, $MnCO_3$ and $Cr_2O_3$ at a molar ratio of 85:13.5:1.5, followed by mixing using a ball mill and then drying using a spray dryer, thus affording a granular mixed powder, which was then compacted in a die under pressure of 600 Kgf/cm$^2$ to form a shaped body having a rectangular parallelepiped shape, after which the shaped body was sintered at a temperature of 1200° C. in an air atmosphere, thereby manufacturing ceramic substrates.

Figure 12:
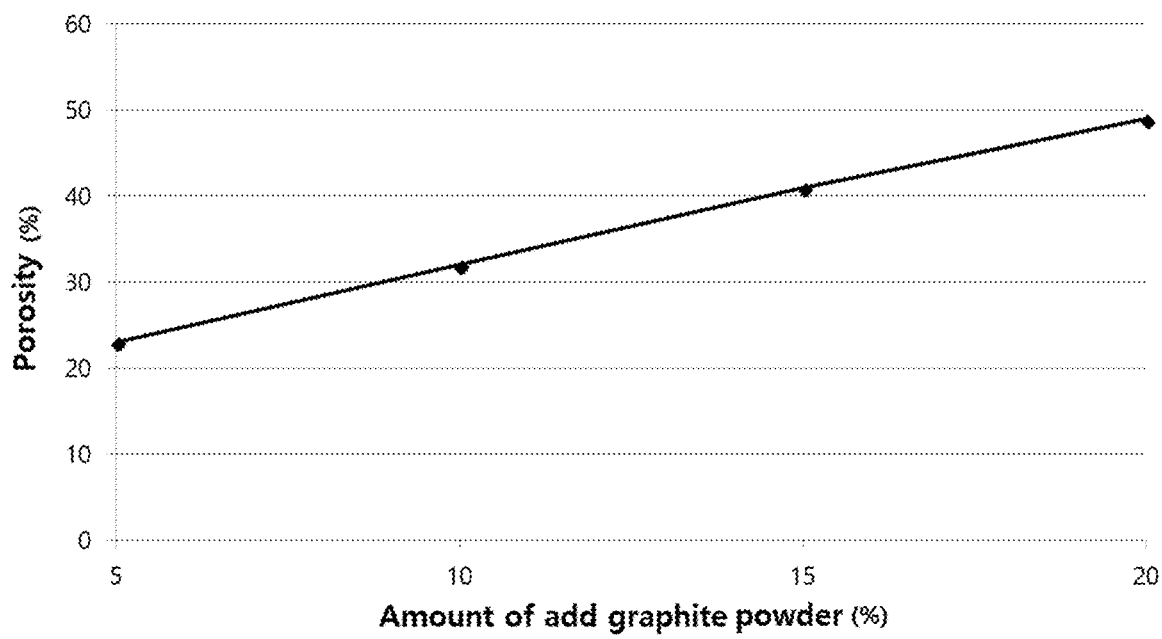
FIG. 12 is a graph showing the results of porosity depending on the amount of graphite powder of each ceramic substrate manufactured through the process of Test Example 6 according to a preferred embodiment of the present invention.
Figure 13:
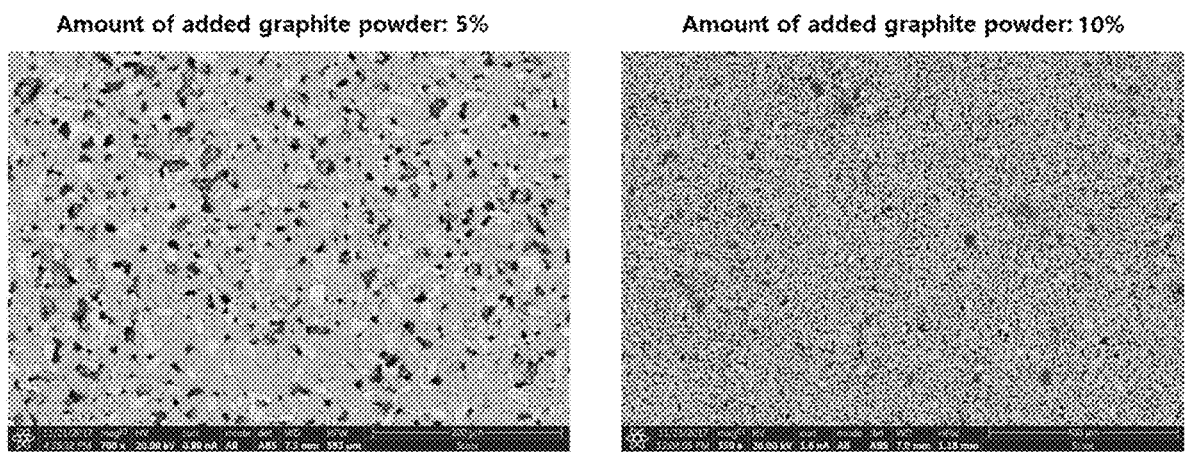
FIG. 13 shows a microstructure of each ceramic substrate manufactured through the process of Test Example 6 according to a preferred embodiment of the present invention.

The porosity of each ceramic substrate depending on the amount of graphite powder was measured. The results are shown in FIGS. 12 and 13. As shown in FIGS. 12 and 13, in order to obtain a porosity of 20 to 50%, corresponding to the porosity of a ceramic substrate having no problem pertaining to vacuum adsorption and strength, it is necessary to add the graphite powder in an amount of 5 to 20% based on the total amount of the mixed powder of $TiO_2$, $MnCO_3$ and $Cr_2O_3$.

Test Example 7

A graphite powder was added in an amount of 10% based on the total amount of a mixed powder of $TiO_2$, $MnCO_3$ and $Cr_2O_3$ at a molar ratio of 85:13.5:1.5, followed by mixing using a ball mill and then drying using a spray dryer, thus affording a granular mixed powder, which was then compacted in a die under pressure of 600 Kgf/cm$^2$ to form a shaped body having a rectangular parallelepiped shape, after which the shaped body was sintered at temperatures of 1,150 and 1300° C. in an air atmosphere, thereby manufacturing ceramic substrates. The microstructure of each ceramic substrate depending on the sintering temperature was observed. The results are shown in FIG. 14.

Figure 14:
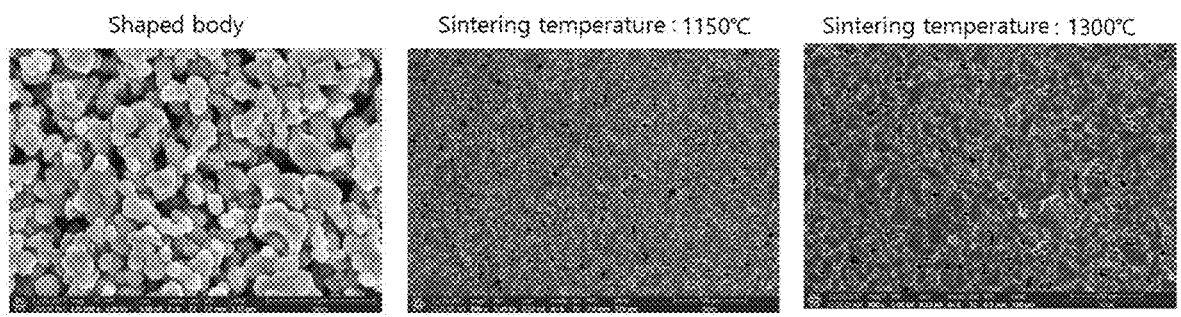
FIG. 14 shows a microstructure of each ceramic substrate manufactured through the process of Test Example 7 according to a preferred embodiment of the present invention.

As shown in FIG. 14, the shaped body had a pore size of about 0.1 to 0.5 μm, indicating that the pore size increased and the number of pores decreased with an increase in the sintering temperature. The substrate sintered at 1150° C. exhibited a porosity of 35% and the substrate sintered at 1300° C. exhibited a porosity of 21%.

As described hereinbefore, the conductive porous ceramic substrate manufactured by the method of manufacturing the conductive porous ceramic substrate according to the present invention can be concluded to have an electrical resistance value suitable for electrostatic prevention and porosity and strength suitable for stable vacuum adsorption of a semiconductor wafer or a display substrate.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a conductive porous ceramic substrate, the method comprising:
   preparing a mixed powder by adding a titanium oxide ($TiO_2$) powder with $MnCO_3$ and $Cr_2O_3$ powders and a graphite powder and performing mixing and drying;
   compacting the mixed powder of $MnCO_3$, $Cr_2O_3$, $TiO_2$ and graphite in a die under pressure to afford a shaped body; and
   sintering the shaped body thus obtained at a temperature ranging from 1000° C. to 1300° C. in an ambient air atmosphere,
   wherein in the preparing the mixed powder, the $TiO_2$ powder, as a main material, is added with the $MnCO_3$ and $Cr_2O_3$ powders, in which the $MnCO_3$ and $Cr_2O_3$ powders are mixed at a molar ratio of 9:1 and the mixed $MnCO_3$ and $Cr_2O_3$ powders are added in an amount of 5 mol % to 15 mol % relative to the $TiO_2$ powder.

2. The method of claim 1, wherein the graphite powder is added in an amount of 5 wt % to 15 wt % based on a total amount of the mixed powder of $MnCO_3$, $Cr_2O_3$ and $TiO_2$.

3. The method of claim 1, wherein the conductive porous ceramic substrate has a surface formed with pores by Mn- and Cr-doped $TiO_{2-x}$ particles and $(Mn,Cr)TiO_3$ particles adjacent to each other, and having a volume resistance ranging from $10^6$ Ω·cm to $10^9$ Ω·cm.

4. The method of claim 1, wherein the conductive porous ceramic substrate has a porosity ranging from 20% to 50%.

* * * * *